United States Patent
Gregor et al.

(10) Patent No.: US 10,387,598 B1
(45) Date of Patent: Aug. 20, 2019

(54) VERIFYING RESULTS IN SIMULATION THROUGH SIMULATION ADD-ON TO SUPPORT VISUALIZATION OF SELECTED MEMORY CONTENTS IN REAL TIME

(71) Applicant: Cadence Design Systems, Inc., San Jose, CA (US)

(72) Inventors: Steven Lee Gregor, Oswego, NY (US); Norman Robert Card, Vestal, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/703,503

(22) Filed: Sep. 13, 2017

(51) Int. Cl.
*G06F 17/50* (2006.01)

(52) U.S. Cl.
CPC .................. *G06F 17/504* (2013.01)

(58) Field of Classification Search
CPC . G06F 17/504; G06F 17/5027; G01R 31/317; G01R 31/31724; G01R 31/318342; G01R 31/31835; G01R 31/318357
USPC ................. 716/106, 136; 714/718
See application file for complete search history.

(56) References Cited

U.S. PATENT DOCUMENTS

| | | | |
|---|---|---|---|
| 2001/0044724 A1* | 11/2001 | Hon ..................... | G06F 17/2715 704/260 |
| 2006/0200713 A1* | 9/2006 | Slobodnik .............. | G11C 29/18 714/718 |
| 2007/0061637 A1* | 3/2007 | Ward .................... | G11C 29/006 714/718 |
| 2009/0106716 A1* | 4/2009 | Aleksanyan ... | G01R 31/318357 716/106 |
| 2012/0193532 A1* | 8/2012 | Wang .................... | G01R 31/307 250/309 |
| 2013/0086541 A1* | 4/2013 | Luo ...................... | G06F 17/5081 716/112 |
| 2014/0279573 A1* | 9/2014 | Coats ................. | G06Q 30/0278 705/306 |
| 2018/0076054 A1* | 3/2018 | Kuo ...................... | H01L 21/568 |

* cited by examiner

*Primary Examiner* — Paul Dinh
(74) *Attorney, Agent, or Firm* — Tarolli, Sundheim, Covell & Tummino LLP

(57) ABSTRACT

An exemplary bitmap file can be provided, which can include, for example, a map of a cell array structure of a memory(ies), a plurality of memory values superimposed on the cell array structure based on a simulated testing of the memory(ies). The memory values may be values being written to the memory(ies) while the memory(ies) is being tested. The memory values may be values in a test pattern(s) being used to test the memory(ies). Each cell in the cell array structure can have a particular memory value superimposed thereon. A cell(s) in the cell array structure may be highlighted, which may correspond to an incorrect memory value.

7 Claims, 10 Drawing Sheets

```
# High Density Single Port SRAM HVT RVT RVT Compiler|CMOS32LP 32nm Process 0.149um^2 Bit
Cell 256 Rows Per Bank

# -instname "sp_1kx4_m8" -words 1024 -bits 4 -frequency 100 -mux 8 -pipeline off -
write_mask off -wp_size 8 -write_thru off -top_layer "m5-m10" -power_type otc -redundancy
off -rcols 2 -rrows 0 -bmux on -ser none -back_biasing off -power_gating off -retention on
-ema on -atf off -cust_comment " " -bus_notation on -left_bus_delim "[" -right_bus_delim "]"
-pwr_gnd_rename "vddpe:VDDPE,vddce:VDDCE,vddce:VDDCE,vsse:VSSE" -prefix " " -name_case upper -rows_p_bl
256 -check_instname on -diodes on -drive 6 -corners
tt_1p0v_25c,ss_0p9v_0p9v_125c,ss_0p9v_0p9v_m40c,ff_1p1v_1p1v_125c,ff_1p1v_1p1v_m40c codefile:

address    bit[0]           bit[1]          bit[2]          bit[3]

```
sp_1kx4_m8 sram(CLK (n_13), CEN (n_304), WEN ((DFT_sdo, n_310,n_313, n_316)), A ((n_319, n_322, n_325, n_328, n_331,
n_334,n_337, n_340, n_343, n_346)), D ((n_349, n_352, n_355, n_358)), EMA (n_302, n_267, n_260), EMAW ((n_317, n_308)),
EMAS (n_174), TEN (n_20), BEN (n_26), TCEN (n_31), TWEN ((n_165, n_156, n_147, n_138)), TA ((n_129, n_120, n_111, n_103,
n_95, n_89, n_83, n_77, n_71, n_65)), TD ((n_60, n_49, n_54, n_43)), TQ ((n_442, n_445, n_448, n_451)), GWEN (n_454), TGWEN
(n_37), RET1N (n_183), PEN (n_192), TPEN (n_200), RRE1 (n_207), FRA1 ((n_472, n_475, n_478, n_481, n_484, n_487, n_490)),
RRE2 (n_215), FRA2 ((n_496, n_499, n_502, n_505, n_508, n_511, n_514)), RRE3 (n_222), FRA3 ((n_520, n_523, n_526, n_529,
n_532, n_535, n_538)), RRE4 (n_230), FRA4 ((n_544, n_547, n_550, n_553, n_556, n_559, n_562)), STOV (n_237), CRE1 (n_245),
CRE2 (n_252), FCA1 ((n_574, n_577)), FCA2 ((n_580, n_583)), CENY (n_99), WENY ((n_106, n_112, n_118, n_124)), AY ((n_130,
n_136, n_142, n_148, n_154, n_160, n_166, n_172, n_178, n_184)), DY ((n_190, n_196, n_202, n_208)), GWENY (n_214), Q
((n_419, n_411, n_404, n_395)), QI (n_244, n_250, n_256, n_262)), PENY (n_268));

reg [1:4096] filename;
integer fd;
initial
  begin
    $swrite (filename, "sp_1kx4_m8.value.changes");
    $display ("filename = %0s\n", filename);
    fd = $fopen( filename, "w");
    $fmonitor(fd,
      "time        = %0t\n", $time,
      "address     = %d\n", sram.TA,
      "data        = %b\n", sram.TD,
      "write       = %d\n", sram.TWEN,
    );
  end
```

FIG. 7

```
array_set column_to_bit_array {
    0  0    1  0    2  0    3  0    4  0    5  0    6  0    7  0
    8  1    9  1   10  1   11  1   12  1   13  1   14  1   15  1
   16  2   17  2   18  2   19  2   20  2   21  2   22  2   23  2
   24  3   25  3   26  3   27  3   28  3   29  3   30  3   31  3
}
```

FIG. 8

VERIFYING RESULTS IN SIMULATION THROUGH SIMULATION ADD-ON TO SUPPORT VISUALIZATION OF SELECTED MEMORY CONTENTS IN REAL TIME

FIELD OF THE DISCLOSURE

The present disclosure relates generally to memory simulation, and more specifically, to embodiments of an exemplary system, method, and computer-accessible medium for verifying results in simulation through simulation add-on to support visualization of selected memory contents in real time.

BACKGROUND INFORMATION

During the testing of a memory, it is common to apply a plurality of patterns to the memory which may be based on the physical structure of the cell array. However, a common concern during testing is whether the patterns have been applied correctly to the memory based on the physical structure of the cell array. For example, in a cell array, it may be beneficial to write a checkerboard pattern (e.g., alternating 1's and 0's), where adjacent cells have different values. In order to write a checkerboard pattern, one must have knowledge of the cell array structure (e.g., what does it look like).

In practice, there is no common method for producing a cell layout. For example, a cell structure may have multiple columns per data bit, with a different addressing structure across the columns. The different cell arrays, however, have to be taken into account during testing, which may be difficult due to the number of possible cell structures. Previously, when determining a memory failure, it was common to write values in a particular manner and then read the same values in the same manner. However, due to the different possible cell structure, there was no way to determine if the correct cell structure was applied to the memory. This is because a failure will generally not occur when reading the same values that were previously written. Thus, in order to determine a failure, a representation of the physical cell array may need to be created.

Thus, it may be beneficial to provide an exemplary system, method, and computer-accessible medium for verifying results in simulation through simulation add-on to support visualization of selected memory contents in real time, which may overcome at least some of the deficiencies described herein above.

SUMMARY

A system, method, and computer-accessible medium for verifying results of a testing of a memory(ies) can be provided, which can include, for example, receiving a bitmap file, and verifying the result of the testing of the memory(ies) based on the bitmap file. The bitmap file can include a map of a cell array structure of a memory(ies), and a plurality of memory values superimposed on the cell array structure based on a simulated testing of the memory(ies). The memory values may be values being written to the memory(ies) while the memory(ies) is being tested. The memory values may be values in a test pattern(s) being used to test the memory(ies). Each cell in the cell array structure can have a particular memory value superimposed thereon. A cell(s) in the cell array structure may be highlighted, which may correspond to an incorrect memory value.

A further exemplary system, method, and computer-accessible medium for verifying results of a testing of a memory(ies) may be provided, which may include, for example, receiving a layout of the memory(ies), receiving a plurality of memory values, and verifying the results of the testing by comparing the memory values to the layout. A memory file(s) may be generated based on the layout. The memory file may be a bitmap file. The layout may include a cell array structure of the memory(ies). Each of the memory values may be superimposed over a cell in the cell array structure. The memory file(s) may be displayed on a display arrangement.

In some exemplary embodiments of the present disclosure, the results may be verified by determining a location of an error(s) in the memory values, which may be highlighted. The results may be verified by determining a location in the memory file(s) having an incorrect memory value written thereto. The memory(ies) may be tested, and the memory values may be received while the memory(ies) is being tested. The memory(ies) may be tested using a test pattern(s), and the memory values may be based on the test pattern(s).

Additionally, an exemplary system, method, and computer-accessible medium for verifying results of a testing of a memory(ies) may be provided, which may include, for example, receiving a layout of the memory(ies), generating a memory file(s) based on the layout, testing the memory(ies), receiving a plurality of memory values during the testing, comparing the memory values to the layout, and verifying the results of the testing based on the comparison.

These and other objects, features, and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features, and advantages of the present disclosure will become apparent from the following detailed description taken in conjunction with the accompanying Figures showing illustrative embodiments of the present disclosure, in which:

FIGS. 2 and 3 are exemplary diagrams illustrating a physical layout of a memory according to an exemplary embodiment of the present disclosure;

FIG. 4 is an exemplary diagram of a bitmap view file according to an exemplary embodiment of the present disclosure;

FIG. 5 is an exemplary diagram of a Wish graphical user interface according to an exemplary embodiment of the present disclosure;

FIG. 6 is an exemplary diagram of a monitor statement according to an exemplary embodiment of the present disclosure;

FIG. 7 is an exemplary diagram of a memory view contents file according to an exemplary embodiment of the present disclosure;

FIG. 8 is an exemplary diagram of a memory view translate file according to an exemplary embodiment of the present disclosure;

Figure 1:
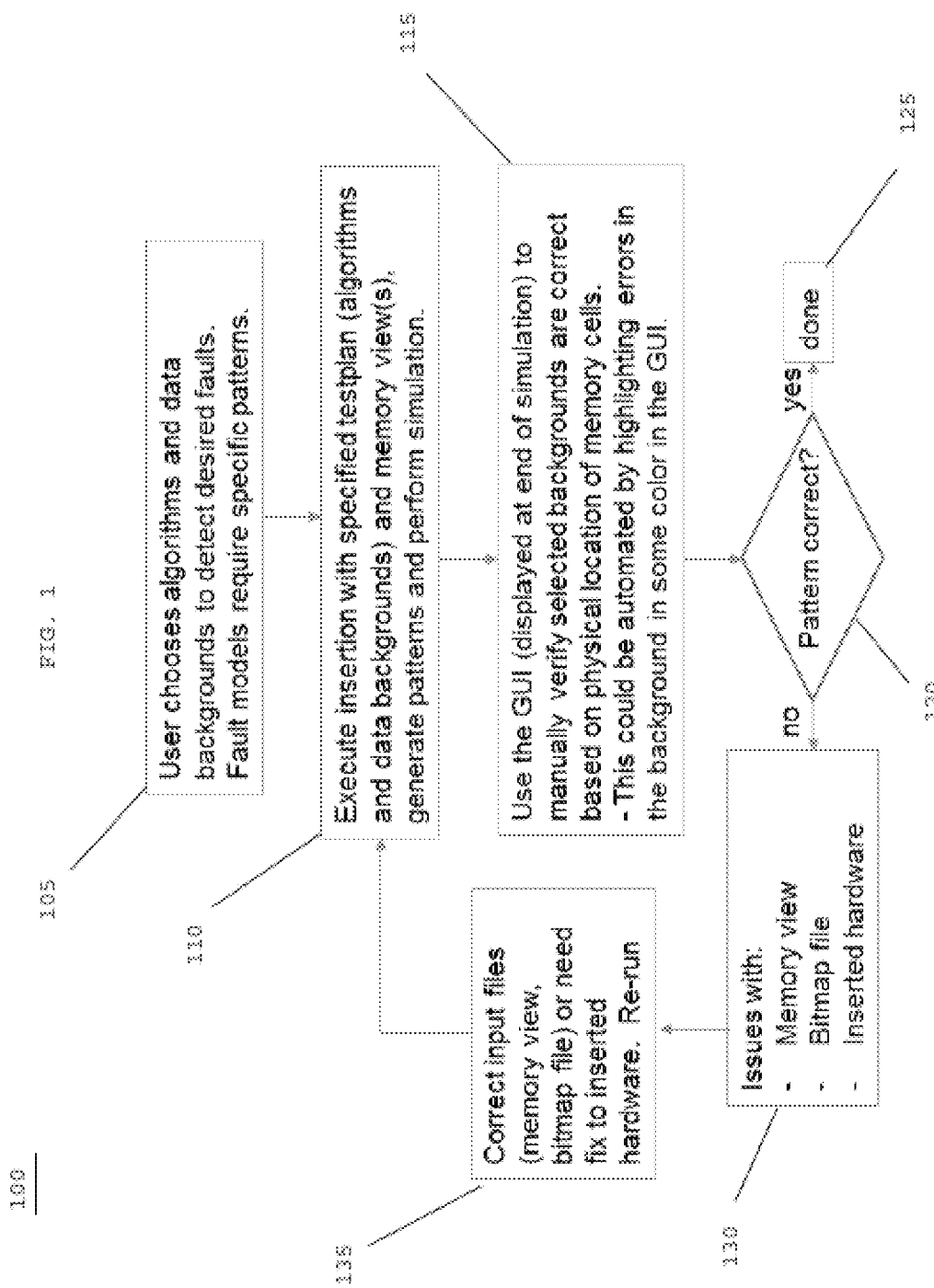
FIG. 1 is an exemplary flow diagram of a method 100 for validating memory test patterns on a physical layout according to an exemplary embodiment of the present disclosure.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures and the appended claims.

DETAILED DESCRIPTION

The exemplary system, method, and computer-accessible medium, according to an exemplary embodiment of the present disclosure, may be used to automatically determine whether the correct physical patterns (e.g., programmable memory built-in self-test ("PMBIST") patterns) are being put out into (e.g., applied to) a memory. Presently, it is difficult to perform simulations on memories to determine if the correct physical patterns have been applied to the memory. The exemplary system, method, and computer-accessible medium, according to an exemplary embodiment of the present disclosure, may be used to analyze either the results of the simulation, or the values being written during simulation, in order to verify that the correct cell array structure is being used.

The exemplary system, method, and computer-accessible medium, according to an exemplary embodiment of the present disclosure, may utilize a bitmap file in order to determine whether the cell array structure has been interpreted correctly. The exemplary bitmap file may include a layout or map of the physical cell array structure of the memory. The bitmap file may be produced by the memory designer/provider and may be used as a verification tool to ensure that the mapping performed during the testing of the memory matches the actual cell array structure of the memory.

The exemplary bitmap file may be provided by a memory vendor (e.g., through use of a memory generator). The bitmap file may contain a physical description/layout of the memory. Either the bitmap view file, or the insertion command which may contain the information internally after processing other user input files, may be used for physical verification of cell patterns during simulation. A simulation application programming interface may be used to track engine memory writes and maps into the physical array created from the bitmap file. It may be used to verify the accuracy of the cell array patterns. The simulation results may be compared against expected physical data background maps.

Using information inside of the bitmap file, the exemplary system, method, and computer-accessible medium may monitor a simulation model to capture or determine information being written into the cell array. This information may be captured and analyzed in real time (e.g., as the information is being written to the cell array). Alternatively, the information may be captured in real time and analyzed at a later time to determine the accuracy of the information written into the cell array.

Prior to the simulation being performed, an image of the cell array may be generated to facilitate monitoring of the particular values being written into particular cells in the array. The image may be based on the bitmap file provided by the memory designer. The information monitored during the simulation may be added to (e.g., superimposed on) the cell array image. The exemplary image may be shown to a user (e.g., on a screen) to facilitate the user to see the values being written into the cell array in real time. The exemplary system, method, and computer-accessible medium, according to an exemplary embodiment of the present disclosure, may then monitor the image file, with the superimposed values on the cell array and may automatically determine if the pattern being written corresponds to the requested pattern. For example, if the tester is simulating a checkerboard pattern, the exemplary system, method, and computer-accessible medium may monitor the cell array image and determine if the checkerboard pattern is being correctly written into the cell array image in real time. Thus, any errors may be detected while the simulation is being performed. Additional suitable patterns may be generated and monitored.

The exemplary cell image may be large depending on the size of the memory. Thus, it may be difficult, if even possible, for the user to visually determine if the pattern is correct. Thus, the exemplary system, method, and computer-accessible medium may automatically analyze the cell array image as the values are being written and identify any errors in the writing process. Error information may then be provided to the user running the simulation, including an indication of where the error occurred (e.g., in which cell array). This information may then be used to determine the cause of the error.

The exemplary system, method, and computer-accessible medium, according to an exemplary embodiment of the present disclosure, may facilitate a user testing a memory using a simulation to easily determine where an error has occurred in real time. The user may determine one or more patterns to write into the cell array and input the patterns into a simulation model. The simulation model may then test the memory by writing and reading the values into the cell array structure. As the simulation is being performed, the exemplary system, method, and computer-accessible medium may monitor the values being written to the memory and apply the values to a cell image, which may be based on a bitmap file provided by the memory designer. The applied values may be analyzed in real time and compared to the one or more input patterns to determine if the values on the cell image deviate from, or match, the values to be written based on the input patterns. If the pattern matches, then an indication may be provided to the user that the pattern matches and that no errors were found. If the pattern does not match, the exemplary system, method, and computer-accessible medium may determine the location of the errors and provide the information to the user. This information may be provided during the simulation. Thus, the user may terminate the simulation before it ends, saving simulation time, as the user does not need to finish the simulation in order to determine if any errors have occurred.

After errors have been determined, the exemplary system, method, and computer-accessible medium may be used to determine the cause of the errors. Errors may generally be caused because of two reasons. First, the test platform being simulated may not be correctly writing to the cell array, which may indicate a problem with the test platform. Alternatively, the information about the cell array structure provided by the memory designer may be incorrect. For example, the cell array may have one structure, but the map provided by the memory designer may be inconsistent and have a different structure. Thus, the simulation results would be incorrect. The exemplary system, method, and computer-accessible medium, according to an exemplary embodiment of the present disclosure, may be used to determine whether the errors are the result of a faulty testplan or a faulty model provided by the memory designer.

In addition to providing a visual indication to the user regarding the values being written to the cell array structure, the exemplary system, method, and computer-accessible medium, according to an exemplary embodiment of the present disclosure, may perform the analysis without providing any real time visual indication regarding the values being written into the cell array structure. Thus, the exemplary system, method, and computer-accessible medium, according to an exemplary embodiment of the present disclosure, may perform a real-time analysis during the simulation and then provide an output to the user of the results of the analysis (e.g., errors found, no errors found). If errors are found while the simulation is being performed, the exemplary system, method, and computer-accessible medium may automatically terminate the simulation, prior to finishing, and provide an indication that an error was found and where the error was located. Alternatively, the exemplary system, method, and computer-accessible medium may let the simulation finish and provide an output of all errors found, if any.

FIG. 1 is an exemplary flow diagram of a method 100 for validating PMBIST test patterns on a physical layout according to an exemplary embodiment of the present disclosure. For example, at procedure 105, a user may choose one or more algorithms and data backgrounds to be used to detect a desired fault. Fault models may be used which may be based on specific input patterns. At procedure 110, the insertion of the PMBIST logic may be performed with specified testplans (e.g., algorithms and data backgrounds) and memory views. The specific patterns may be generated, and the simulation may be run (e.g., performed). At procedure 115, an interface (e.g., a graphical user interface ("GUI")) may be used to verify that selected backgrounds are correct based on the physical location of the memory cells. This display may be shown in real time (e.g., while the simulation is being performed) or at the end of the simulation. Alternatively, or in addition, the verification of the selected backgrounds may be automated (e.g., determined using the exemplary system, method, and computer-accessible medium). The output of the automated verification process may be shown to the user (e.g., indicating an error and its associated location, or no errors).

At procedure 120, if the pattern is correct, then the method may end at procedure 125. If the pattern is not correct, a determination of the cause of the error may be made at procedure 130. Causes may include, but are not limited to, errors in the memory view, the provided bitmap file, and the inserted hardware itself. At procedure 135, the input files may be corrected (e.g., in the memory view or in the bitmap file). Alternatively, or in addition, the inserted hardware may be fixed and reinserted. The simulation may then be performed again at procedure 110.

An exemplary insertion tool (e.g., insert_dft pmbist) may be used to select specific algorithms and test conditions (e.g., (i) address_orders, (ii) address update, and/or (iii) data_backgrounds) to insert into the user design to be used for testing. Patterns may be generated using, for example, write_pmbist_testbench, which may be used to create a testbench in Verilog format that may be used for simulation. Exemplary fmonitor statements may be utilized in (e.g., added to) a Verilog simulation netlist after memory instantiation to print out time, address, data and/or if a read/write operation is being performed. The inclusion of the fmonitor statements and tasks may be performed automatically via scripting.

New init_mem and print_mem_contents tasks may be added to the Verilog testbench. The exemplary simulation may be run with a "–loadpli1<shared_library>:<bootstrap_function>" option that loads a shared library, which may include new Verilog tasks. For example, init_mem may be used to perform initialization tasks. Additionally, print_mem_contents may be used to execute the translate.script (e.g., to process the bitmap memory view, process the data generated by the fmonitor statements during simulation, and then finally call a wish.script to display the physical contents of the memory). The translate.script and wish.script are explained in more detail below.

Exemplary Input into Insertion Tool

The physical layout of the memory may be described to the insertion tool using the address partition statement. For our example, this may take the form of:

address_partition {row 9:3 column 2:0 order {data 0 1}{0 1 2 3 4 5 6 7 {data 2 3} 7 6 5 4 3 2 1 0}}

Figure 10:
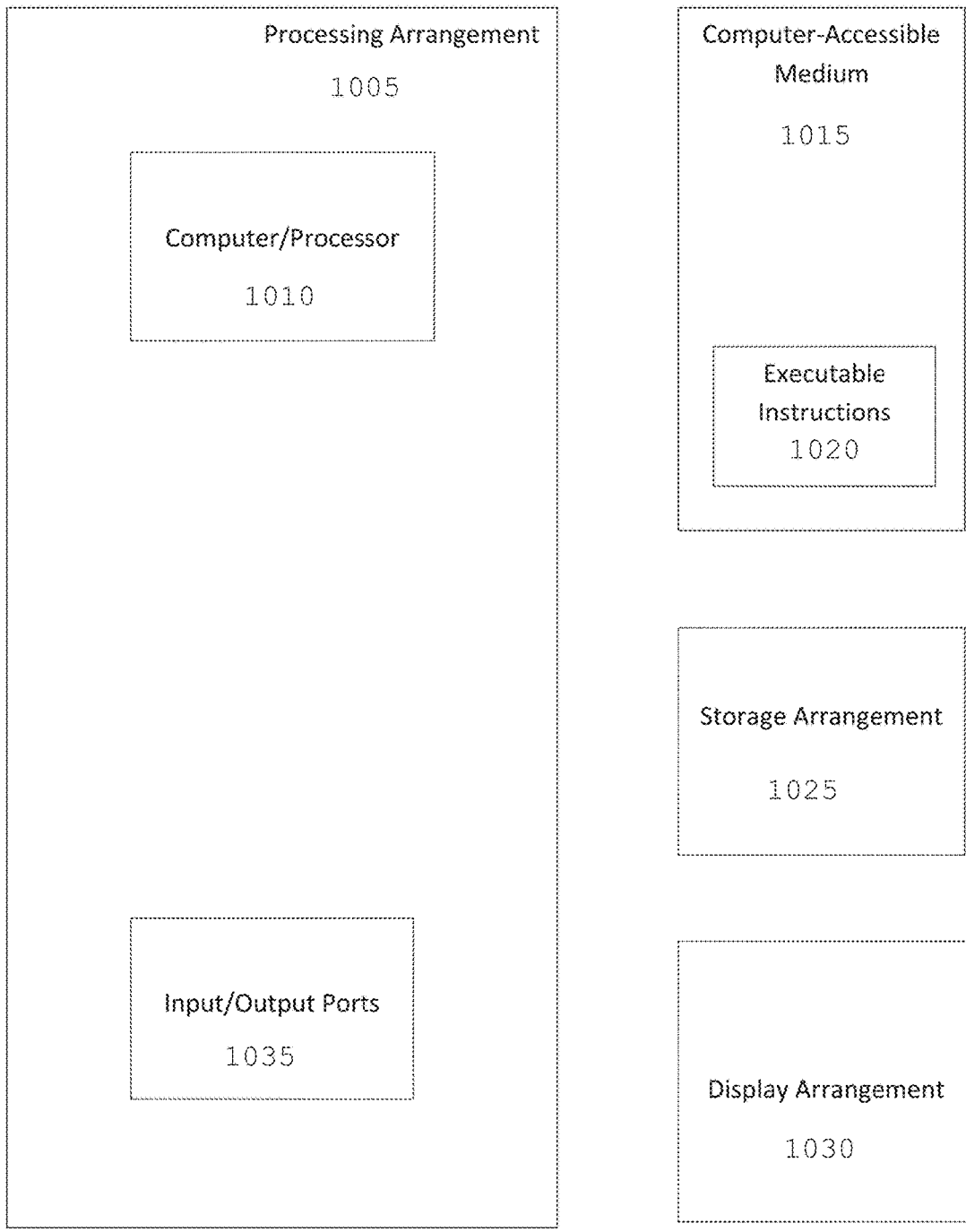
FIG. 10 is an illustration of an exemplary block diagram of an exemplary system in accordance with certain exemplary embodiments of the present disclosure.

FIGS. 2 and 3 are exemplary diagrams illustrating a physical layout of a memory according to an exemplary embodiment of the present disclosure. As shown in FIGS. 2 and 3, 10 total address bits (e.g., 1024 words) may be used, with bits 0->2 used to select a column 205, and bits 3->9 used to select a row 210. Thus, there may be 128 rows (2^7 row bits) and 8 columns (2^3) for each data bit (4). The user may then use the exemplary testplan construct to request particular algorithms and data_backgrounds to run, which may include, for example:

testplan {
name testplan_1
algorithms {scan}
address_orders {fr}
address_updates {li}
data_backgrounds {checkerboard}
data_orientation word
hardwired
}
algorithm
  {
    name scan
    {
    (w0)
    (r0)
    dn(w1)
    dn(r1)
    }
  }
}

Exemplary Translate Script

An exemplary translate.script command may be used to process a bitmap memory view and create a physical view of the memory. Inputs may include, mem_name <memory name>, which is the name of memory and inputfile <file name>, which is the input memory view (e.g., bitmap view file) to be processed. The number of bits and column multiplexing factor extracted from options used to generate the memory may be located inside the bitmap view file. Each valid line may have an address in the first position, then (number of bits)*2 number of columns after the first portion. The first column in a pair may be the true version of the bit, and the second column in a pair may be the complement version. This data is generated in an X, Y coordinate system. FIG. 4 shows an exemplary bitmap view file according to an exemplary embodiment of the present disclosure.

The X, Y coordinates may be used to generate a file showing the physical location of each address and bit (e.g., <memory name>.physical). Exemplary file locations are shown in Table 1 below.

TABLE 1

| 0,0t | 1,0t ‖ | 2,0t | 3,0t ‖ | ... | 3,3t | 2,3t ‖ | 1,3t | 0,3t ‖ |
|---|---|---|---|---|---|---|---|---|
| 8,0t | 9,0t ‖ | 10,0t | 11,0t ‖ | ... | 11,3t | 10,3t ‖ | 9,3t | 8,3t ‖ |
| 16,0t | 17,0t ‖ | 18,0t | 19,0t ‖ | ... | 19,3t | 18,3t ‖ | 17,3t | 16,3t ‖ |
| ... | ... | ... | ... | ... | ... | ... | ... | ... |
| 1000,0t | 1001,0t ‖ | 1002,0t | 1003,0t ‖ | ... | 1003,3t | 1002,3t ‖ | 1001,3t | 1000,3t ‖ |
| 1008,0t | 1009,0t ‖ | 1010,0t | 1011,0t ‖ | ... | 1011,3t | 1010,3t ‖ | 1009,3t | 1008,3t ‖ |
| 1016,0t | 1017,0t ‖ | 1018,0t | 1019,0t ‖ | ... | 1019,3t | 1018,3t ‖ | 1017,3t | 1016,3t ‖ |

The ellipses in Table 1 denote missing columns/rows. In this example, there are 32 columns and 128 rows in total. The format of the data is <address>,<bit>[t|c] where t may indicate true, and c may indicate its complement. Next, the <memory name>.value.changes file is included, which was created by the monitor statements (e.g., added to the Verilog testbench) during simulation. This file may contain the values for each address and data bit for the algorithm. Using the <memory name>.physical and <memory name>.value.changes file, a new file called <memory name>.contents may be created. This file may contain 0/1 values for each physical location in the memory. The column to bit correlation may be saved to a hidden file called <memory name>.translate.data, which may be used by the wish.script that displays the contents in a GUI.

Exemplary Wish Script

The wish.script command may be used to graphically display the physical contents of the memory using information generated by the translate.script. The input may include mem_name <memory name>, which is the name of the memory. The <memory name>.contents file may be used to populate a GUI and display the physical contents of the memory. A user may hover over a specific bit to highlight the row and column and show the specific information stored therein. FIG. 5 shows an exemplary wish GUI. For example, as shown in FIG. 5, the column 3 in data bit 0 for physical row 4 has been selected as denoted by highlighting 505 (e.g., by the user).

FIG. 6 shows exemplary monitor statements that may be included in a simulation netlist. The monitor statements may print out the time, address, data bit, and value of the write enable pin (e.g., indicating if a read or write operation is happening).

Verilog, or other hardware design language, may be used for the exemplary simulation. An exemplary simulation setup procedure is detailed below.

```
task sim_setup;
begin
    total_good_compares=0;
    total_miscompares=0;
    ... Other setup items
    $init_mem("sp_1kx4_m8");
end
endtask
```

The sim_setup task may be called before the simulation is started.

```
task sim_cleanup;
begin
    // Print out memory contents
    $print_mem_contents("sp_1kx4_m8");
end
endtask
```

The sim_cleanup task may be called after the simulation is complete.

Exemplary Memory View Contents File

FIG. 7 shows a memory view contents file according to an exemplary embodiment of the present disclosure. This memory may be described as, for example:

address_partition {row 9:3 column 2:0 order {data 0 1} {0 1 2 3 4 5 6 7} {data 2 3} {7 6 5 4 3 2 1 0}}

The exemplary memory shown in FIG. 7 is 1024 words wide and has a column multiplexing factor of 8 (e.g., 3 column bits). In this example, there are 128 physical rows and 32 columns. The number of columns (e.g., 32 columns) may be derived from having 4 data bits (e.g., the column multiplexing factor of 8 times the number of data bits). The number of rows (e.g., 128 rows) may be derived from 1024 being reduced by the column multiplexing factor of 8 (e.g., 1024/8=128). FIG. 8 shows an exemplary memory view translate file. The first value is the column and the second value is the bit. Thus, "9 1" means column 9 is located in bit 1.

Figure 9:
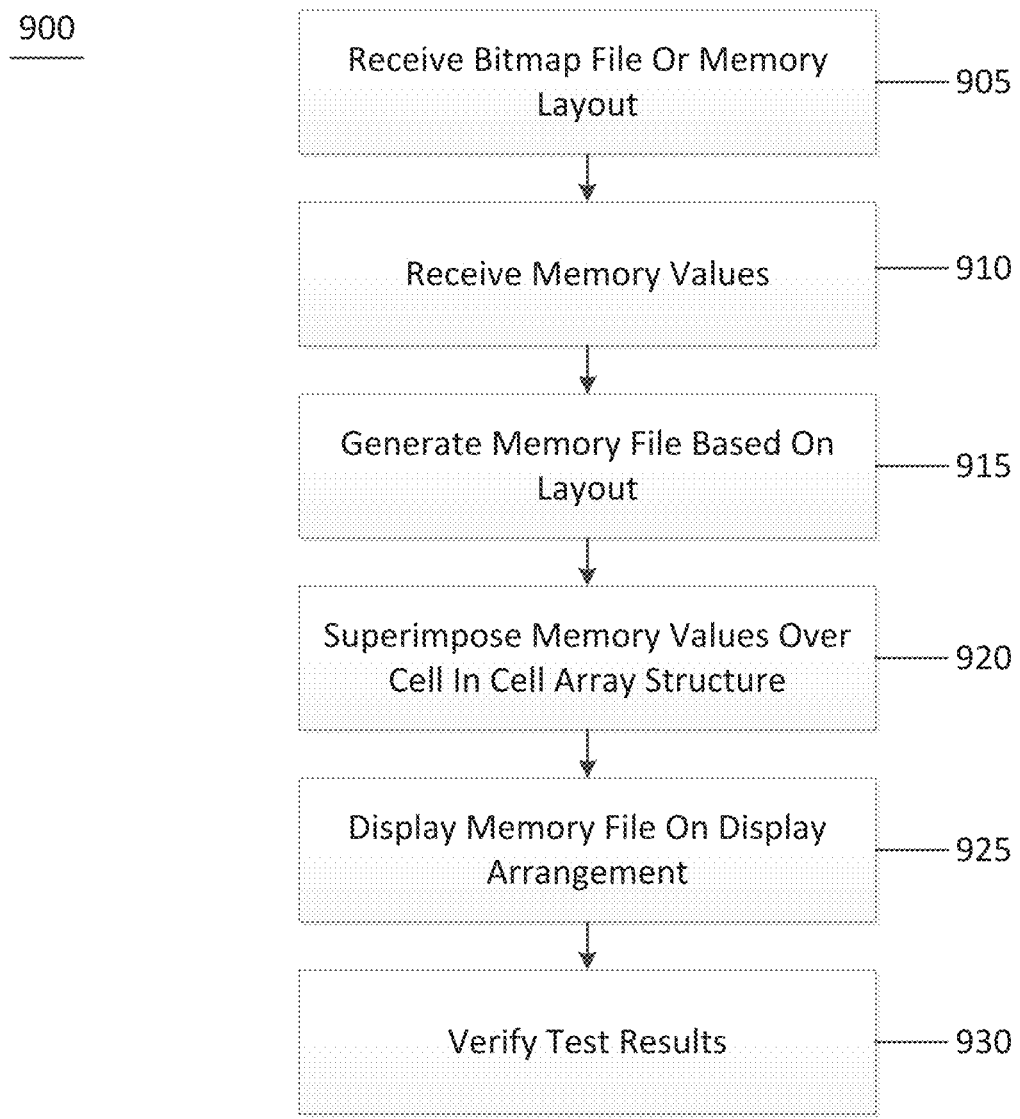
FIG. 9 is an exemplary flow diagram of a method for verifying results of a testing of a memory according to an exemplary embodiment of the present disclosure.

FIG. 9 is a flow diagram of a method for verifying results of a testing of a memory according to an exemplary embodiment of the present disclosure. For example, at procedure 905, a bitmap file can be received, or alternatively, a layout of a memory can be received. At procedure 910, a plurality of memory values can be received. At procedure 915, a memory file can be generated based on the layout. At procedure 920, the memory values can be superimposed over a cell in a cell array structure. At procedure 925, the memory file can be displayed on a display arrangement. At procedure 930, the results of the testing can be verified by comparing the memory values to the layout, which can include determining a location of an error in the memory values and highlighting the error. The results can be verified by determining a location in the memory file that has an incorrect memory value written thereto. In certain exemplary embodiments of the present disclosure, the memory can be tested and the memory values may be received while the memory is being tested.

FIG. 10 shows a block diagram of an exemplary embodiment of a system according to the present disclosure. For example, exemplary procedures in accordance with the present disclosure described herein may be performed by a processing arrangement and/or a computing arrangement 1005. Such processing/computing arrangement 1005 may be, for example, entirely or a part of, or include, but not limited to, a computer/processor 1010 that may include, for example, one or more microprocessors and use instructions stored on a computer-accessible medium (e.g., RAM, ROM, hard drive, or other storage device).

As shown in FIG. 10, for example, a computer-accessible medium 1015 (e.g., as described herein above, a storage device such as a hard disk, floppy disk, memory stick, CD-ROM, RAM, ROM, etc., or a collection thereof) may be provided (e.g., in communication with the processing arrangement 1005). The computer-accessible medium 1015 may contain executable instructions 1020 thereon. In addition or alternatively, a storage arrangement 1025 may be provided separately from the computer-accessible medium 1015, which may provide the instructions to the processing arrangement 1005 so as to configure the processing arrangement to execute certain exemplary procedures, processes, and methods, as described herein above, for example.

Further, the exemplary processing arrangement 1005 may be provided with or include an input/output arrangement 1035, which may include, for example, a wired network, a wireless network, the internet, an intranet, a data collection probe, a sensor, etc. As shown in FIG. 10, the exemplary processing arrangement 1005 may be in communication with an exemplary display arrangement 1030, which, according to certain exemplary embodiments of the present disclosure, may be a touch-screen configured for inputting information to the processing arrangement in addition to outputting information from the processing arrangement, for example. Further, the exemplary display arrangement 1030 and/or a storage arrangement 1025 may be used to display and/or store data in a user-accessible format and/or user-readable format.

The foregoing merely illustrates the principles of the disclosure. Various modifications and alterations to the described embodiments will be apparent to those skilled in the art in view of the teachings herein. It will, thus, be appreciated that those skilled in the art will be able to devise numerous systems, arrangements, and procedures which, although not explicitly shown or described herein, embody the principles of the disclosure and may be, therefore, within the spirit and scope of the disclosure. Various different exemplary embodiments may be used together with one another, as well as interchangeably therewith, as should be understood by those having ordinary skill in the art. In addition, certain terms used in the present disclosure, including the specification, drawings, and claims thereof, may be used synonymously in certain instances, including, but not limited to, for example, data and information. It should be understood that, while these words, and/or other words that may be synonymous with one another, may be used synonymously herein, there may be instances when such words may be intended to not be used synonymously. Further, to the extent that the prior art knowledge has not been explicitly incorporated by reference herein above, it is explicitly incorporated herein in its entirety.

What is claimed is:

1. A method for verifying results of a testing of at least one memory, comprising:
   receiving a layout of the at least one memory, wherein the layout includes a physical layout identifying physical coordinates of a true version and a complementary version of each bit within a cell array structure of the at least one memory;
   generating at least one memory file based on the layout of the at least one memory, wherein the at least one memory file comprises a given memory file characterizing a physical location of each address, bit and corresponding bit version type in the cell array structure;
   receiving a plurality of test pattern memory values;
   using a computer hardware arrangement, simulating testing of a given cell block of a cell array structure of the at least one memory, wherein the simulating comprises:
      superimposing each of the plurality of test pattern memory values over the given cell block in the cell array structure based on the physical layout characterized in at least one memory file;
   displaying on a display arrangement, based on the at least one memory file, a visual representation of the physical layout of the given cell block with the plurality of test pattern memory values superimposed on the given cell block in the cell array structure;
   verifying the results of the testing by comparing the memory values to the layout to detect errors while the simulation is being performed; and
   outputting information on the display arrangement characterizing the results of the testing.

2. The method of claim 1, the at least one memory file comprises a plurality of memory files and wherein another of the plurality of memory files is a bitmap file.

3. The method of claim 1, wherein the computer hardware arrangement is configured to verify the results by determining a location of at least one error in the memory values.

4. The method of claim 3, further comprising highlighting the at least one error in the visual representation of the physical layout of the given cell block.

5. The method of claim 1, wherein the computer arrangement is configured to verify the results by determining a location in the at least one memory file having an incorrect memory value written thereto.

6. The method of claim 1, further comprising receiving the memory values while the at least one memory is being tested.

7. A non-transitory computer-accessible medium having stored thereon computer-executable instructions for verifying results of a testing of at least one memory, wherein, when a computer arrangement executes the instructions, the computer arrangement is configured to perform procedures comprising:
   receiving a layout of the at least one memory, wherein the layout includes a physical layout identifying physical coordinates of a true version and a complementary version of each bit within a cell array structure of the at least one memory;
   generating at least one memory file based on the layout of the at least one memory, wherein the at least one memory file comprises a given memory file characterizing a physical location of each address, bit and corresponding bit version type in the cell array structure;
   simulating testing of the at least one memory, the simulating comprises;
      receiving a plurality of test pattern memory values during the testing;
      superimposing each of the plurality of test pattern memory values over the given cell block in the cell array structure based on the physical layout characterized in at least one memory file;
   displaying on a display arrangement, based on the at least one memory file, a visual representation of the physical layout of the given cell block with the plurality of test pattern memory values superimposed on the given cell block in the cell array structure;
   comparing the memory values to the layout;
   verifying the results of the testing based on the comparison to detect errors while the simulation is being performed; and outputting information on the display arrangement characterizing the results of the testing.

\* \* \* \* \*